United States Patent [19]

Akram et al.

[11] Patent Number: 5,609,995
[45] Date of Patent: Mar. 11, 1997

[54] METHOD FOR FORMING A THIN UNIFORM LAYER OF RESIST FOR LITHOGRAPHY

[75] Inventors: Salman Akram; Paul Shirley; William Rericha, all of Boise, Id.

[73] Assignee: Micron Technology, Inc., Boise, Id.

[21] Appl. No.: 520,871

[22] Filed: Aug. 30, 1995

[51] Int. Cl.⁶ ........................................... G03F 7/00
[52] U.S. Cl. .................. 430/327; 430/311; 430/330; 430/329
[58] Field of Search .................. 430/269, 311, 430/327, 329, 330; 427/58, 96

[56] References Cited

U.S. PATENT DOCUMENTS

| | | | |
|---|---|---|---|
| 4,239,790 | 12/1980 | Bosenberg | 427/54.1 |
| 5,202,222 | 4/1993 | Harris | 430/315 |
| 5,227,001 | 7/1993 | Tamaki | 156/345 |
| 5,512,154 | 4/1996 | Rischke | 204/204 |

*Primary Examiner*—Kathleen Duda
*Attorney, Agent, or Firm*—Stephen A. Gratton

[57] ABSTRACT

A method for forming a layer of resist on a non-planar substrate includes the steps of: dispensing resist onto the substrate; spinning the substrate to spread the resist; and then vibrating the substrate to eliminate voids in the resist. Optionally, the substrate can be inverted and vibrated at the same time to distribute the resist over the sidewalls of any projections or plateaus on the non-planar substrate. Following the vibrating and optional inversion steps, the resist is partially hardened, an edge bead is removed and a backside of the resist is washed. These steps are followed by soft bake, exposure and development of the layer of resist.

32 Claims, 3 Drawing Sheets

METHOD FOR FORMING A THIN UNIFORM LAYER OF RESIST FOR LITHOGRAPHY

FIELD OF THE INVENTION

The present invention relates generally to lithography and more particularly to a method for forming a thin uniform layer of resist on a substrate such as a silicon wafer. The method is particularly suited to forming non-planar silicon structures and devices for semiconductor manufacture.

BACKGROUND OF THE INVENTION

Lithography processes such as photolithography and e-beam lithography utilize resist formulations (e.g., photoresist, e-beam resist). A layer of resist is conventionally applied to a substrate by means of a spin coating process. In accordance with this process, the substrate is secured to a chuck of a coat track apparatus typically using a vacuum. The spin process includes three stages: dispensing the resist solution onto the substrate, accelerating the substrate to a desired rotational speed, and then spinning at a constant speed to establish the desired thickness for the resist. The goal of the deposition process is to apply a uniform, adherent, defect-free layer of resist over the entire substrate. This layer of resist can then be used to form a resist mask. For example, a layer of photoresist can be exposed in a desired pattern using UV radiation directed through a reticle. During a development step, the unexposed resist for a negative tone resist or the exposed resist for a positive tone resist is removed to form the resist mask. In a similar manner, an electron beam resist can be exposed using a focused electron beam and then developed using suitable developers to form a resist mask.

Most spin coating processes are performed at a constant rotational speed of approximately 2000–6000 rpm for 3–30 seconds. A total process time is about 60 seconds. Processes other than spin coating have also been employed to form a layer of resist on a substrate. For example, resist has been extruded in continuous sheet form while the substrate is moved under an extrusion nozzle. Chemical vapor deposition, in which a resist layer is deposited in the presence of a plasma onto the surface of a substrate has also been used. In addition, resist sputtering techniques have been employed. One problem with these alternative methods for forming a layer of resist is that specialized equipment and procedures are required. Moreover, these specialized equipment and processes can be incompatible with equipment and processes conventionally used in volume semiconductor manufacture. For example, standard coat tracks for spinning on resist cannot be used with the above processes.

In the semiconductor industry, silicon structures are constantly being developed which are non-planar. For example, in the manufacture of known good die (KGD), test carriers are used for testing and burning-in the dice. These test fixtures typically include an electrical interconnect adapted to establish a temporary electrical connection with the die. U.S. Pat. No. 5,408,190 to Wood et al. describes such a test fixture.

The interconnects for these test fixtures can include a substrate formed of a material such as silicon. Raised projections can be formed integrally with the substrate in a pattern that matches the size and spacing of the bond pads on the dice. The raised projections and a conductive layer deposited on the projections form contact members for contacting the bond pads on the die to form the temporary electrical connection. The height of each projection, as measured from the top of the substrate to the tip of the projection, can vary from a few angstroms to about 100 μm. In a subsequent lithographic process, it is difficult to apply resist to the substrate using a spin coating process because the resist coats unevenly on the raised topography. In particular, voids are formed in some areas, such as between the projections, and these areas do not uniformly coat with resist. The sidewalls of the projections are also difficult to coat with resist because the resist tends to slide off of the sidewalls. This results in almost no resist coverage on the sidewalls.

Another example of a non-planar topography that is difficult to uniformly coat with a layer of resist occurs in the manufacture of DRAMs. In some cases metallization interconnect layers must be formed on substrates having a non-planar topography. For example, an uneven or non-planar topography can be caused by the formation and stacking of various semiconductor devices beneath the interconnect layers. By way of example, U.S. Pat. No. 5,354,705 to Mathews et al., discloses a method for forming semiconductor structures having a non-planar topography. Coating resist on this type of non-planar topography using conventional techniques, such as spin coating, can lead to voids and non-uniform coverage.

Other silicon structures can also have non-planar topographies and projecting structures of varying height. When it is necessary to apply resist to these raised, non-planar topographies, the conventional application methods as described above provide poor results. In particular a conformal, void free layer of resist cannot be applied with a uniform thickness and does not adequately cover the sidewalls of various projecting structures or plateaus.

OBJECTS OF THE INVENTION

In view of the foregoing, there is a need in the art for an improved method for applying a thin, uniform layer of resist to a non-planar substrate and particularly to non-planar silicon substrates and semiconductor structures used in the semiconductor industry.

Accordingly, it is an object of the present invention to provide a method for applying a thin, relatively conformal and void-free layer of resist to a non-planar substrate.

It is another object of the present invention to provide a method for applying resist to a non-planar substrate using conventional apparatus such as a modified coat track apparatus.

It is yet another object of the present invention to provide an improved method for forming non-planar silicon structures and semiconductor structures using a layer of resist deposited in accordance with the invention.

Other objects, advantages and capabilities of the present invention will become more apparent as the description proceeds.

SUMMARY OF THE INVENTION

In accordance with the present invention, an improved method and apparatus for forming a layer of resist on a non-planar substrate are provided. The method, simply stated, includes the steps of: dispensing a layer of resist on the substrate; spinning the substrate to spread the resist over the substrate; and then vibrating the substrate to eliminate voids in the resist.

An optional additional step comprises inverting the substrate (i.e., turning the substrate upside down) for a brief period while vibrating the substrate. For a non-planar substrate having projecting structures, inversion helps to distribute the resist along the sidewalls of the projecting structures. The inverting step can be part of the vibrating step or performed as an additional step, if desired. As another optional additional step, the substrate can be spun during the vibrating step and also during the optional inverting step.

The vibrating step and optional inverting step are followed by a proximity bake to partially harden the layer of resist; edge bead removal to remove resist at the edges of the substrate; a backside wash of the substrate; and then soft bake to drive off solvents in the layer of resist. The layer of resist can then be exposed and developed using conventional techniques to form a resist mask for use in further processing of the substrate (e.g., etching, deposition, ion implantation).

A layer of resist deposited by the above method is characterized by a conformal and void free consistency as compared to a layer of resist deposited by a conventional spin process. In particular, the vibrating step helps to eliminate voids that would otherwise be present during a conventional spin deposition process. In addition, the optional inversion step helps to evenly distribute the resist on raised portions of the non-planar topography of the substrate. The uniformity of the layer of resist improves the resolution of subsequent lithographic processes performed using the resist. Critical process parameters include the viscosity of the resist, the frequency at which the substrate is vibrated, the speed at which the substrate is rotated and the time for the spinning and vibrating steps.

DETAILED DESCRIPTION OF THE PREFERRED EMBODIMENTS

As used herein the term resist refers to a chemical solution in which chemical and physical changes can be induced by exposure to an exposure energy (e.g., UV radiation, electron beam, x-ray). Such a resist can be exposed by directing the exposure energy through a reticle and then developed to form a resist mask which can be used for further processing of the substrate such as etching and ion implantation. The method of the invention can be used to deposit commercially available resist formulations including photoresist, e-beam resist and x-ray resist.

Figure 1:
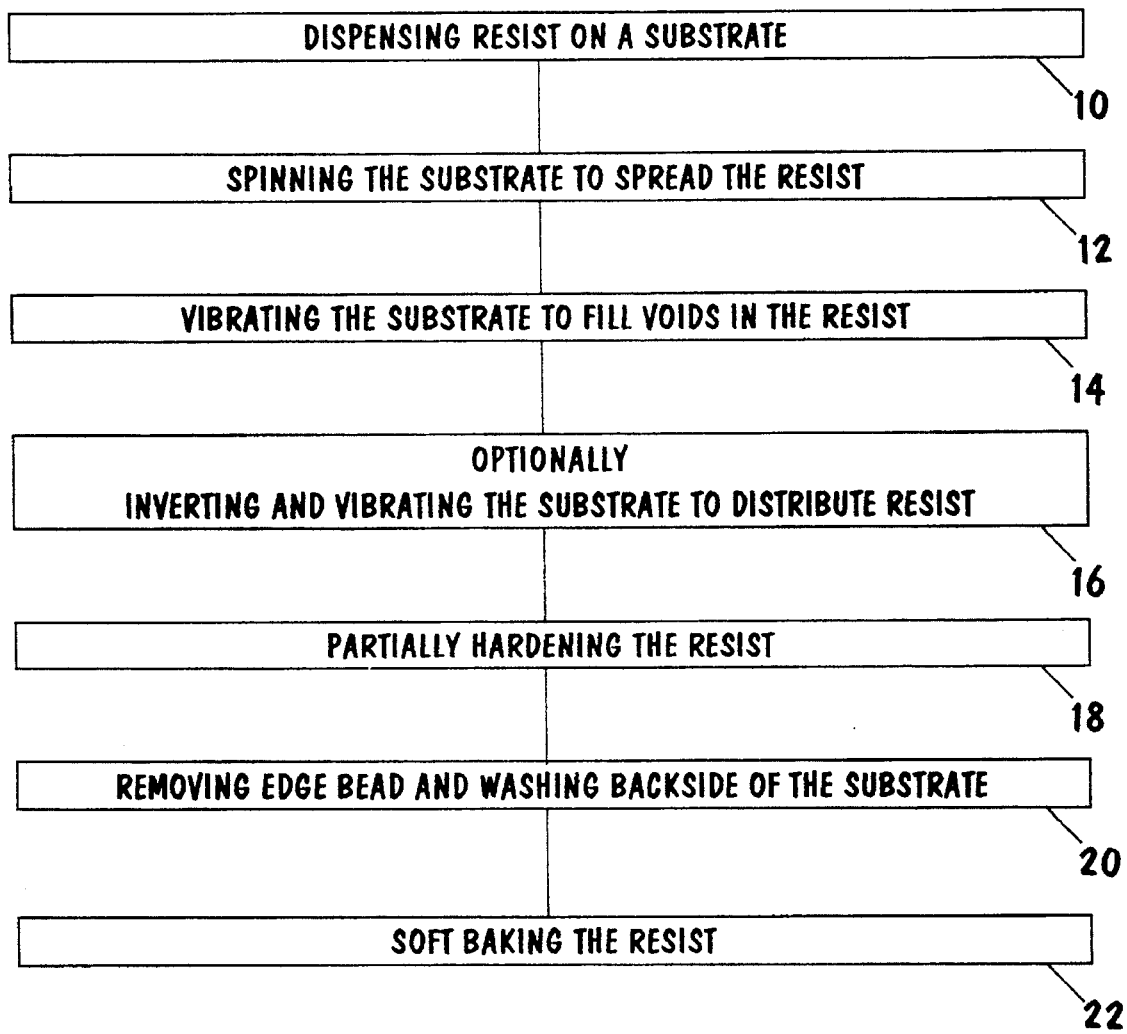
FIG. 1 is a flow diagram of the process steps included in the method of the invention.

Referring now to FIG. 1, the method of the invention is outlined. The method includes the steps of: dispensing resist on a substrate, step 10; spinning the substrate to spread the resist, step 12; vibrating the substrate to fill voids, step 14; optionally, inverting and vibrating the substrate to evenly distribute the resist on the substrate, step 16; partially hardening the resist, step 18; removing an edge bead and washing a backside of the substrate, step 20; and then soft baking the resist, step 22.

Figure 3:
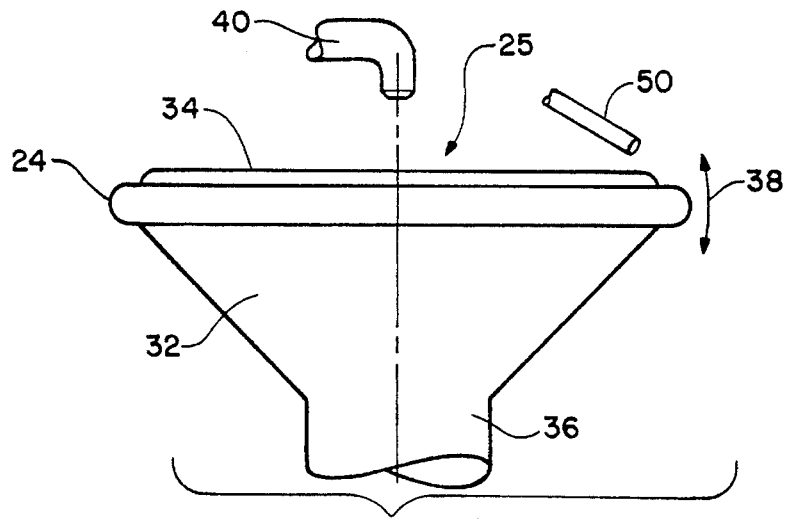
FIG. 3 is a schematic side elevation view of an apparatus for coating a layer of resist on a substrate in accordance with the method of the invention.
Figure 4:
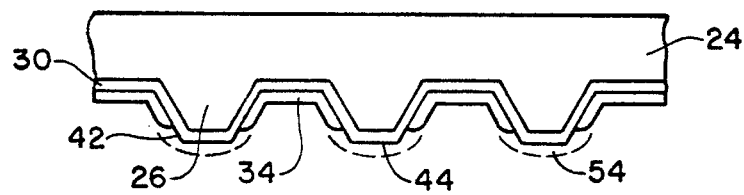
FIG. 4 is a schematic side elevation view of the substrate illustrating an optional additional step wherein the substrate is inverted and vibrated.
Figure 5:
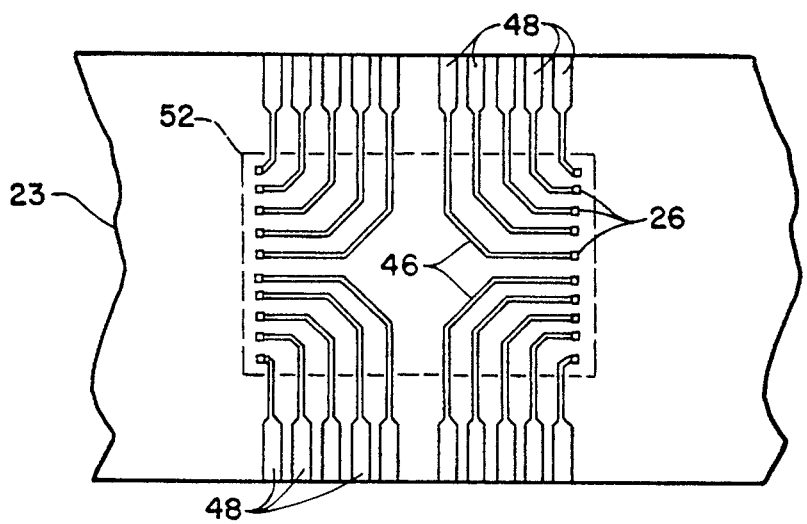
FIG. 5 is a schematic plan view of an interconnect for testing unpackaged semiconductor dice constructed using a layer of resist deposited in accordance with the invention.
Figure 6A:
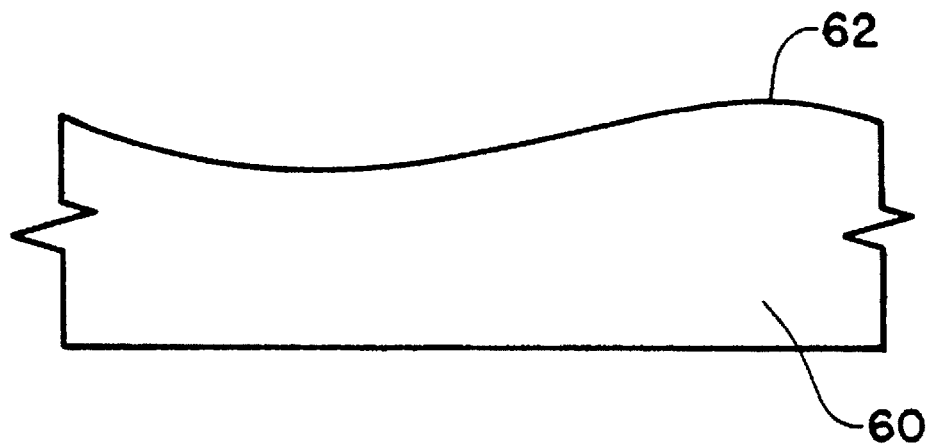
FIG. 6A is a schematic side elevation view of a non-planar substrate which can be patterned using a layer of resist deposited in accordance with the invention.
Figure 6B:
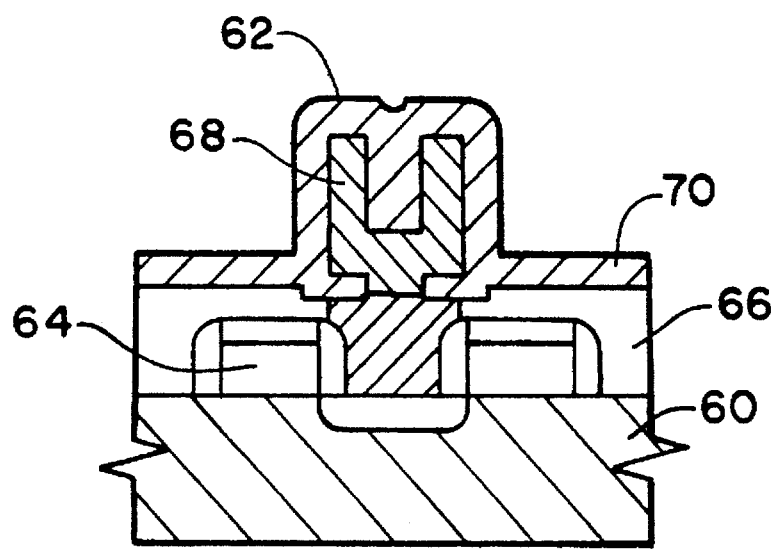
FIG. 6B is an enlarged cross sectional view of a portion of FIG. 6A illustrating non-planar semiconductor devices formed on the substrate.

In FIGS. 2–5 the method of the invention is illustrated in the formation of an interconnect for testing unpackaged semiconductor dice. The completed interconnect 23 is shown in FIG. 5. Such an interconnect 23 can be used with a tester as described in the previously cited U.S. Pat. No. 5,408,190 for testing unpackaged semiconductor dice. In FIGS. 6A and 6B, semiconductor structures having a non-planar topography are illustrated which can also be effectively coated with a layer of resist in accordance with the method of the invention.

Figure 2:
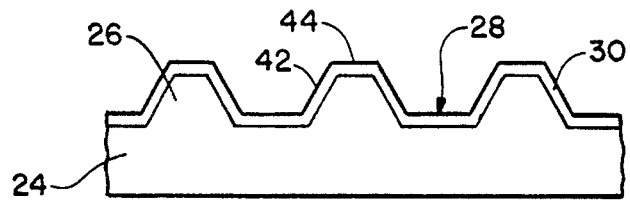
FIG. 2 is a schematic side elevation view of a substrate having a non planar topography including projecting structures to be coated with a layer of resist in accordance with the method of the invention.

With reference to FIG. 2, a substrate 24 for the interconnect 23 (FIG. 5) includes one or more raised projections 26 extending outwardly from a surface of the substrate to form a non-planar surface 28. The substrate 12 is formed of a material having a coefficient of thermal expansion (CTE) that closely matches the CTE of a silicon die. Suitable materials for the substrate 12 include monocrystalline silicon, silicon-on-glass and silicon-on-sapphire.

The raised projections 26 are generally pyramidal in cross section and include sloped sidewalls 42 and a generally flat tip portion 44. The raised projections 26 can be formed integrally with the substrate 24 using a wet or dry, isotropic or anisotropic, etch process. During such an etch process, a mask layer (e.g., silicon nitride) is formed on the substrate 24 and then patterned with openings and solid areas to form masking blocks. During the etching process, the raised projections 26 are formed as the substrate 24 under the masking blocks is undercut by the etchant reacting with the substrate 24.

Various methods for forming a substrate 24 with raised projections 26 are disclosed in copending, commonly assigned U.S. patent application Ser. No. 08/387,687 and in U.S. Pat. No. 5,326,428 which are incorporated herein by reference. Depending on the application, these raised projections 26 can be formed with a height of from a few angstroms to 100 µm or more. In addition, the raised projections 26 themselves can also include other projecting structures (not shown) such as sharpened blades for piercing contact locations on a die to a limited penetration depth. The raised projections 26 for the interconnect 23 (FIG. 5) are spaced apart with a separation distance that matches the spacing of bond pads on a semiconductor die. This spacing is typically on the order of 50–100 µm.

As shown in FIG. 2, the substrate 24 also includes a conductive layer 30 which is blanket conformably deposited on the substrate 24. The conductive layer 30 is formed of a highly conductive metal such as aluminum that will be etched to form conductive traces 46 (FIG. 5) to the projections 26. The projections 26 and conductive traces 46 form contact structures for contacting the bond pads of a die 52 to establish temporary electrical connections for testing. The conductive traces 46 include bonding sites 48 (FIG. 5) for wire bonding or attaching a mechanical connection (e.g., electrical clips) to external test circuitry. This permits test signals to be applied to the die 52 for burn-in and functionality testing. In order to etch the conductive layer 30 to form the conductive traces 46, a layer of resist 34 (FIG. 3) will be formed on the substrate 24 in accordance with the method of the invention.

Prior to the deposition process the substrate 24 can be primed with a suitable primer such as hexamethyldisilazane (HMDS). The HMDS can be applied by spin coating or by vapor priming. In either case, a monolayer of HMDS is formed on the surface of the substrate 24 which will improve the adhesion of the subsequently applied layer of resist 34.

Initially, as shown in FIG. 3, the substrate 24 is attached to a chuck 32 of a wafer coat track 25 (or spin coater). The chuck 32 includes a vacuum mechanism (not shown) for removably attaching the substrate 24 using a vacuum force. The coat track 25 includes a spindle 36 adapted to rotate the chuck 32 and substrate 24 at speeds of from 0–10,000 rpms. In accordance with the invention, the spindle 36 is also adapted to move the chuck 32 and substrate 24 up and down with a vibrational motion as indicated by vibration arrow 38. The vibrational motion of the chuck 32 can be achieved by modifying a standard coat track to include a vibrator motor that is mechanically coupled to the spindle 36. As an example, a Model No. 8800 coat track manufactured by Silicon Valley Group can be modified such that the spindle can be selectively vibrated at a frequency of about one to 5000 cycles/second.

The coat track 25 also includes a dispensing nozzle 40 for dispensing resist onto the substrate 24. The dispensing step (step 10 FIG. 1) can be performed by flooding the entire substrate 24 prior to the spin step (step 12 FIG. 1) or by dispensing a small volume of resist at the center of the substrate 24 while the substrate 24 is spun at speeds of about 200–400 rpm for several seconds. This also known as a spread cycle.

Following the dispensing step (step 10 FIG. 1), the substrate 24 is accelerated as quickly as possible to a spin speed that will spread the layer of resist 34 across the surface of the substrate 24 (step 12 FIG. 1)). By way of example, the substrate 24 can be spun for about 3 to 60 seconds at a speed of from 2000 to 6000 rpms.

Next, the substrate 24 is subjected to a vibration step (step 14 FIG. 1) in order to fill any voids present in the layer of resist 34. With a non-planar topography, such as illustrated in FIG. 2, voids will occur in the layer of resist 34 in areas between the projections 26. Furthermore, the layer of resist 34 in these areas tends to be confined and unevenly distributed. By vibrating the substrate 24, the voids are filled in and a more uniform distribution pattern for the layer of resist 34 is achieved. By way of example, the vibration step (step 14 FIG. 1) can be performed for about one to sixty seconds at a frequency of about one to 5000 cycles per second.

As an optional additional step during the vibrating step, the substrate 24 can also be rotated. By way of example, rotation during the vibration step (step 14 FIG. 1) can be on the order of 10 rpms to 100 rpms.

As another optional additional step the substrate 24 can be inverted (step 16 FIG. 1). This can be a separate step or a part of the vibrating step. As shown in FIG. 4, inverting the substrate 24 tends to distribute the resist 34 along the sidewalls 42 and tip portions 44 of the projections 26. Specifically, the resist 34 flows down the sidewalls 42 and over the tips 44 of the projections 26 as indicated by the dotted resist profile 54. The inverting step (step 16 FIG. 1) is performed for only a short period of time to prevent dripping of the resist 34 from the tip portions 44 of the projections 26. In addition, the substrate 24 can be vibrated and also spun during the inverting step (step 16 FIG. 1 By way of example, the substrate 24 can be inverted for about one second to 100 seconds while being spun at a speed of about one to 2000 rpms and vibrated at a frequency of about one to 500 cycles/second.

The viscosity of the resist must be selected to allow the resist to be easily distributed during vibration and invertion but without flying or dripping entirely off the substrate 24. The resist viscosity and the spin speed are primary factors in determining the final thickness of the deposited layer of resist 34. In general, resist viscosity is dependent upon the solids content and temperature. A dynamic viscosity of the resist is expressed in poise (P) which equals one dyne second/cm. A centipoise (cP) equals 0.01 P. Resist viscosities are also specified by some manufacturers as a kinematic viscosity in units of centistokes (cSt). A centistoke is the dynamic viscosity divided by the resist density in g/cm$^3$. A suitable viscosity range for the resist is about 1 to 100 cSt over a temperature range of about room temperature to 100° C. In addition, either a positive tone or a negative tone resist formulation can be used to practice the method of the invention.

Following the vibrating (step 14 FIG. 1) and optional inverting step (step 16 FIG. 1), the layer of resist 34 is partially hardened (step 18 FIG. 1) to facilitate the subsequent edge bead removal and back side washing step (step 20 FIG. 1). Partial hardening can be achieved by heating the substrate 24 and layer of resist 34 using a convection oven. Alternately a hot plate or infrared oven can be utilized for the partial hardening step. Using a convection oven, partial hardening can be achieved by heating the layer of resist 34 to a temperature of about 60° C. to 120° C. for about 10 to 90 seconds.

Next, the substrate 24 is subjected to a combined edge bead removal and back side wash (step 20 FIG. 1) to remove any edge bead formed during the spinning step (step 12 FIG. 1) and to remove any resist present on a back side of the substrate 24. Edge bead removal and back side wash can be accomplished by directing a solvent through nozzles 50 (FIG. 3) at the circumferential edge and backside of the substrate 24. At the same time the substrate 24 is spun at a speed of about 200 to 5000 rpms.

Following edge bead removal and backside wash (step 20 FIG. 1), the layer of resist 34 is soft baked (step 22 FIG. 1). The soft baking step is intended to drive solvents from the layer of resist 34 and improve adhesion between the layer of resist 34 and the substrate 24. The soft baking also anneals stresses developed in the layer of resist 34. Soft baking can be performed using a hot plate in which the substrate 24 and layer of resist 34 are heated to a temperature of about 60° C. to 120° C. for about 10 to 90 seconds. Soft baking can also be performed using a convection oven or using an infrared oven.

Following the soft baking step (step 22 FIG. 1), the layer of resist 34 can be exposed and developed using conventional techniques. The layer of resist 34 can then be used to etch the conductive layer 30 (FIG. 2) to form conductive traces 46 (FIG. 5). FIG. 5 shows the completed interconnect 23 with the semiconductor die 52 superimposed thereon.

Referring now to FIGS. 6A and 6B, another application for the method of the invention is illustrated. In FIG. 6A a semiconducting substrate 60 includes a non-planar topography 62. FIG. 6B is an enlarged view of the substrate 60 and non-planar topography 62. The non-planar topography 62 is formed by various semiconductor devices formed on the substrate 60. These semiconductor devices include field effect transistors 64 embedded in a dielectric layer 66, a capacitor 68 in electrical communication with the field effect transistors 64, and a conductive layer 70. Previously cited U.S. Pat. No. 5,354,705 incorporated herein by reference, describes a method for forming the semiconductor structure illustrated in FIG. 6B. For forming the semiconductor structure of FIG. 6B, the conductive layer 70 can be patterned and etched using a layer of photoresist 72 deposited using the method of the invention.

Thus the invention provides a method for depositing a layer of photoresist on a non-planar topography. In an illustrative embodiment, the invention has been described in the formation of a silicon interconnect for testing unpackaged semiconductor dice. However, other non-planar semiconductor structures such as illustrated in FIG. 6B can also be formed using the method of the invention. Thus as will be apparent to those skilled in the art, certain changes and modifications can be made without departing from the scope of the invention as defined by the following claims.

What is claimed is:

1. A method for forming a layer of resist on a non-planar substrate, said method comprising:
   dispensing resist onto the substrate;
   spinning the substrate to spread the resist;
   vibrating the substrate;
   removing an edge bead of resist from the substrate; and
   heating the resist.

2. The method as recited in claim 1 and further comprising spinning the substrate during the vibrating step.

3. A method for forming a layer of resist on a non-planar substrate comprising:
   dispensing resist onto the substrate;
   spinning the substrate to spread the resist;
   vibrating the substrate; and
   back side washing the substrate following the vibrating step.

4. The method as recited in claim 3 and further comprising inverting the substrate during the vibrating step.

5. The method as recited in claim 3 and further comprising spinning the substrate during the vibrating step.

6. The method as recited in claim 3 and further comprising exposing and developing the layer of resist.

7. A method for forming a layer of resist on a substrate, said method comprising:
   providing a substrate having a non-planar surface;
   dispensing resist onto the substrate;
   spinning the substrate to spread the resist;
   vibrating the substrate to remove voids in the resist;
   removing an edge bead from the resist;
   washing a backside of the substrate; and
   heating the resist.

8. The method as recited in claim 7 and further comprising spinning the substrate during the vibrating step.

9. The method as recited in claim 8 and further comprising inverting the substrate following the vibrating step.

10. The method as recited in claim 9 and further comprising spinning the substrate during the inverting step.

11. The method as recited in claim 10 and further comprising providing the non-planar substrate with raised projections and distributing the resist over sidewalls of the projections.

12. The method as recited in claim 10 and further comprising providing the non-planar substrate with various semiconductor devices and distributing the resist over the semiconductor devices.

13. A method for forming a layer of resist on a substrate, said method comprising:
   providing a substrate having a non-planar surface including a plurality of raised projections having sidewalls;
   dispensing resist onto the substrate;
   spinning the substrate to distribute the resist over the substrate;
   vibrating the substrate to eliminate voids in the resist;
   inverting the substrate to distribute the resist on the sidewalls; and
   removing an edge bead from the resist and washing a backside of the substrate.

14. The method as recited in claim 13 and wherein the substrate is vibrated during the vibrating step at a frequency of about one to 5000 cycles per second.

15. The method as recited in claim 14 and wherein the substrate is vibrated during the vibration step for about one to 60 seconds.

16. The method as recited in claim 15 and wherein the substrate is spun during the spinning step at a speed of about 2000 to 6000 rpms.

17. The method as recited in claim 16 and further comprising spinning the substrate during the vibrating step.

18. The method as recited in claim 17 and further comprising spinning the substrate during the inverting step.

19. The method as recited in claim 18 and further comprising spinning the substrate during the inverting and vibrating steps at a speed of from one to 2000 rpms.

20. The method as recited in claim 19 and further comprising partially hardening the resist prior to the edge bead removing step.

21. A method for forming a layer of resist on a substrate, said method comprising the steps of:
   providing the substrate with a plurality of raised projections and a conductive layer thereon;
   dispensing resist onto the substrate;
   spinning the substrate to spread the resist over the substrate;
   vibrating and spinning the substrate to eliminate voids in the resist;
   inverting and spinning the substrate to distribute the resist over the projections;
   soft baking the resist;
   exposing the resist;
   developing the resist to form a resist mask; and
   etching the conductive layer using the resist mask.

22. The method as recited in claim 21 and further comprising removing an edge bead of resist from the substrate and washing a backside of the substrate prior to soft baking the resist.

23. The method as recited in claim 21 and wherein the substrate is formed of silicon.

24. The method as recited in claim 21 and wherein the substrate is formed as an interconnect for testing unpackaged semiconductor dice.

25. A method for forming a layer of resist on a substrate having a non-planar topography, said method comprising:
   dispensing resist onto the substrate;
   spinning the substrate; and
   inverting and vibrating the substrate to eliminate voids in the resist.

26. The method as claimed in claim 25 and further comprising heating the resist following the inverting and vibrating step.

27. The method as claimed in claim 25 and further comprising spinning the substrate during the inverting and vibrating step.

28. The method as claimed in claim 25 and further comprising washing a back side of the substrate following the inverting and vibrating step.

29. The method as claimed in claim 25 and further comprising removing an edge bead from the resist following the inverting and vibrating step.

30. The method as claimed in claim 25 and further comprising providing the substrate with a plurality of raised projections and wherein the resist is dispensed over the projections.

31. The method as claimed in claim 25 and further comprising providing the substrate with a conductive layer, dispensing the resist over the conductive layer, and following the inverting and vibrating step, etching the conductive layer using the layer of resist.

32. The method as claimed in claim 25 and further comprising testing a semiconductor die using the substrate.

* * * * *